United States Patent [19]

Satek et al.

[11] Patent Number: 4,975,413
[45] Date of Patent: Dec. 4, 1990

[54] SUPERCONDUCTOR-COATED CARBON FIBER COMPOSITES

[75] Inventors: Larry C. Satek, Wheaton, Ill.; William F. Bennett, Hartsdale, N.Y.; David A. Schulz, Fairview Park, Ohio

[73] Assignee: Amoco Corporation, Chicago, Ill.

[21] Appl. No.: 84,614

[22] Filed: Aug. 12, 1987

[51] Int. Cl.⁵ .............................................. B32B 3/00
[52] U.S. Cl. ......................................... 505/1; 505/701; 505/702; 505/704; 428/408; 428/688; 428/930
[58] Field of Search ................. 29/599; 428/408, 688, 428/930; 505/1, 701, 702, 704; 427/62

[56] References Cited

U.S. PATENT DOCUMENTS

| | | | |
|---|---|---|---|
| 3,594,226 | 7/1971 | Thomas | 29/599 X |
| 4,005,183 | 1/1977 | Singer | 423/447.2 |
| 4,581,289 | 4/1986 | Dietrich et al. | 428/379 |
| 4,585,696 | 4/1986 | Dustmann et al. | 428/367 X |
| 4,826,808 | 5/1989 | Yusek et al. | 505/1 |

FOREIGN PATENT DOCUMENTS 0286014  3/1988  European Pat. Off. .
63-24452 10/1988  Japan .

OTHER PUBLICATIONS

Poeppel et al, Fab. of $YBa_2Cu_3O_7$ Super-Ceramics, *Chem of H-T Sup-Cond*, Nelson, ACS, 1987.

*Primary Examiner*—Patrick Ryan
*Attorney, Agent, or Firm*—Reed F. Riley; William H. Magidson; Ralph C. Medhurst

[57] ABSTRACT

Superconducting composites are made from ceramic-type superconductors coated onto a low resistivity carbon fiber selected from those high strength fibers which have an ultrahigh modulus and high thermal conductivity. Flexible conductors of several different structures made from such composites are described as well as other useful forms of the composites.

16 Claims, 1 Drawing Sheet

SUPERCONDUCTOR-COATED CARBON FIBER COMPOSITES

BACKGROUND OF THE INVENTION

This invention relates to a superconductor-carbon fiber composite comprising a high strength, ultrahigh modulus, high thermal conductivity carbon fiber which is coated with a ceramic-type superconductor. More particularly, this invention relates to superconducting, super-conductor-carbon fiber composites comprised of a high strength, ultrahigh modulus, high thermal conductivity, low resistivity carbon fiber which is coated with an adhering layer of a ceramic-type superconductor such as a rare earth (R.E.), Ba, Cu, oxide-type superconductor (1-2-3,superconductor), which composite is capable of achieving significant current densities at high magnetic field strengths under superconducting conditions. The term carbon fiber as used herein includes both a carbon monofilament as well as a bundle of monofilaments (a yarn).

Recently, a number of published reports have appeared which describe superconducting ceramic-type materials composed of a combination of rare earth (e.g. yttrium) oxide, barium oxide and copper oxide which have significantly higher superconduction transition temperatures than earlier materials such as Nb/Ti alloys, niobium carbonitride and the like. Superconducting transition temperatures above 77° K. (the boiling point of liquid nitrogen) are commonly found for these materials, and even higher transition temperatures are considered possible based upon recent revisions to existing theories explaining superconducting behavior. The economic advantage that these new superconductors could have over previously existing lower superconducting-transition-temperature superconductors is large enough that many new uses for superconductors now can be devised and present uses enormously improved. However, because these new mixed-oxide superconductors are brittle, ceramic-like materials, they do not lend themselves easily to fabrication in the form of high strength, wire-type geometries, a requirement for many important uses to which superconductors have been put in the past. These uses largely revolve about strong field magnets used in high energy physics, traffic engineering, etc.

One way of fabricating a brittle superconducting material in wire-like form is set forth in an article by K. Brennfleck et al. entitled "Chemical Vapor Deposition of Superconducting Niobium Carbonitride Films on Carbon Fibers" which was published in Proceedings of the 7th Conference on Chemical Vapor Deposition, Electrochemical Society (1979) at p. 300. This article describes depositing a niobium carbonitride layer directly onto a THORNEL ® 400 multifilament yarn by chemical vapor deposition (CVD) to form a superconducting composite. However, the Brennfleck et al. composites employ a low thermal conductivity, more reactive carbon fiber and the structure shown in the photomicrographs accompanying the article is a poor physical structure. Additional aspects of niobium carbonitride-carbon fiber based superconducting composites are taught in U.S. Pat. Nos. 4,299,861; 4,581,289; and 4,657,776. Recently, ultrahigh modulus, high thermal conductivity carbon fibers of low resistivity have become available which will perform most, if not all, the stabilization required for carbon fiber superconducting composite operation. See, for example, U.S. Pat. No. 4,005,183 Singer granted to Union Carbide. Thus, the need for the outermost copper coating used in the previous literature for stabilization is either reduced or eliminated resulting in simpler and more economical devices.

The usefulness of an intermediate carbide or oxide layer between a carbon fiber and a niobium carbonitride superconductor layer to improve adhesion of the superconductor is taught in U.S. Pat. No. 4,585,696. Such a layer depends upon its intermediate (to the fiber and superconductor) coefficient of expansion to achieve its adhesive effect.

The new mixed-oxide ceramic-type superconductors are different in physical properties than the Brennfleck et al. niobium carbonitride material and these differences lead to different considerations for fabricating the superconductor into wire-like form. For example, the niobium compound has a cubic crystal structure and its critical current and critical fields are isotropic, i.e., the same along each of its three crystallographic axes. The new 1-2-3 superconductors on the other hand show a much smaller critical current and critical field along the c crystallographic axis than along the a and b crystallographic axes. Thus, it may be important to align the a b planes of the 1-2-3 superconductor microcrystals as completely as possible parallel to the fiber axis for maximum effectiveness when made in a superconducting device.

Now it has been found that ceramic-type superconductors such as the recently discovered R.E., Ba, Cu oxide-type superconductors can be formed on low resistivity, high thermal conductivity, high strength, ultrahigh modulus carbon fibers in adhering layers by several different techniques to yield useful superconducting composites. Additionally, it is possible that at least some preferred orientation of the superconductor microcrystals on the fiber can be produced, which composites can be formed into strong, flexible conductors capable of exhibiting substantial critical currents and critical magnetic fields under superconducting conditions.

SUMMARY OF THE INVENTION

Described herein is a superconducting composite comprising a low resistivity, high strength, ultrahigh modulus carbon fiber, said fiber coated with an adhering layer of a ceramic-type superconductor.

Also described is a superconducting composite comprising a low resistivity, high strength, ultrahigh modulus carbon fiber exhibiting high thermal conductivity, said fiber coated with an adhering layer of superconducting mixed oxide having a transition temperature above 77° K., which mixed oxide is of formula $A_1 B_2 Cu_3 O_{7-x'}$ wherein A is one or more elements selected from the group consisting of yttrium, lanthanum and the lanthanides, B is one or more Group IIA elements, and x is a number between 0 and 1.

DETAILED DESCRIPTION OF THE INVENTION

Figure 1:
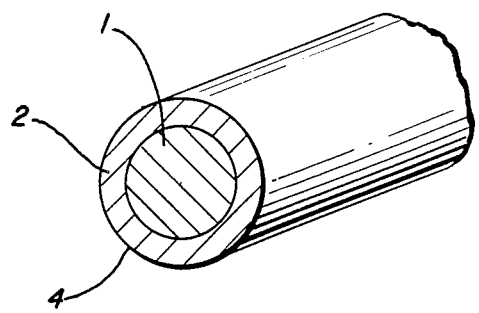
FIG. 1 shows an idealized cross-section view of one possible structure for a composite of the instant invention which shows a carbon fiber that has been coated with a layer of ceramic-type superconductor and an outer protective enrobing layer.

The type of carbon fiber useful for the invention described herein is a fiber made from pitch, polyacrylonitrile (PAN), rayon and the like. Such fibers can be made by extrusion through a spinnaret of melted pitch, "PAN dope" or "rayon dope." The useful fibers, in tape, sheet or tube form, can contain one to several thousand or more individual monofilaments per bundle. Typical of such yarns are THORNEL ® pitch, PAN-based, and rayon-based fibers which are supplied as continuous length, high strength bundles consisting of varying number of fibers, twisted or untwisted. The ultrahigh modulus, pitch-based, high thermal conductivity carbon fibers are preferred since beside the ultrahigh modulus and high thermal conductivity, the higher temperature method of their preparation makes them more graphitic and hence oriented, and more resistant to oxidative attack. However, fibers from PAN or rayon sources could also be preferred if their properties could match those made of pitch. It is preferred to use untwisted carbon fiber yarns for the purposes of this invention.

The carbon fiber useful herein is a low resistivity fiber. Fibers made from the feeds described above are of low resistivity, but typically the lower the resistivity the better suited the fiber for this invention. Any improvement on their resistivity such as by doping with $SbF_5$ and the like is desirable as long as strength, modulus and thermal conductivity do not particularly suffer. Resistivities of less than about 3 μohm-m are typical for these fibers, but fibers of higher resistivity (less than 20 μohm-m) may be used. Preferred are fibers having a resistivity of less than about 1.5 μohm-m. Thickness of the carbon fiber useful herein is dictated to some extent by the use to which the superconducting composite is to be put, but it should be thick enough to avoid easy fiber breakage and not so thick as to preclude the fiber showing the flexibility normally expected of an electrical conductor, if the end result is used for that purpose. Length of the fiber typically depends upon the end use of the composite and the method of making the composite. The tensile strength of the carbon fiber should be generally above about 150 ksi and, more preferably, above about 300 ksi. Most preferably, it is above about 350 ksi. Such high strength fibers give composites which, when used to wind superconducting magnets, can help withstand the stress produced by the high fields produced in high magnetic field superconducting magnets. A thermal conductivity at least about 20 percent as great as copper (390 watts/m/° C. at 20° C.) is preferred, and a value of at least that of copper is more preferred. Most preferred, is a fiber having a thermal conductivity at least twice that of copper. A modulus of at least 20 Msi is useful, but a modulus of at least about 80 Msi and, more preferably, of at least about 100 Msi is preferred.

Pitch-based fibers are preferred here as they can be more inert during laying down of the superconductor layer, have high strength, ultrahigh modulus, and have higher thermal conductivity and lower resistivity. Also, the orientation of the basel planes of the graphitic microcrystals composing the pitch-based fiber surface is more parallel to the fiber length. Most preferred are the pitch-based grades of THORNEL ® fibers such as P-100, P-120, P-130. Other carbon fibers with strengths, moduli and thermal conductivities similar to the THORNEL ® pitch-based grades are also preferred.

The superconductors useful in the invention described herein are ceramic-type superconductors. They include niobium carbonitride and oxide, the $La_2CuO_4$ materials and, importantly, the recently-discovered, so-called, 1-2-3 superconductors. These latter materials are of general formula $A_1 B_2 Cu_3 O_{7-x}$ where A is one or more elements selected from yttrium, lanthanum or a lanthanide, B is one or more Group IIA metal such as calcium, strontium or barium, etc., and x runs between 0 and 1. These materials can be made by heating mixtures of, for example, an yttrium compound, a barium compound, a copper (II) compound in the proportions given by the general formula above and annealing in an oxygen-containing or releasing atmosphere. A typical compound is $YBa_2Cu_3O_{6.93}$. They have crystal structures which are based upon the Perovskite structure and superconducting transition temperatures between about 90° and about 98° K., although it is likely that certain members of the family will show higher superconducting transition temperatures. Also, there is some indication that the copper or oxygen portion of these superconductors can be in part or completely replaced by another element, and it is meant to cover such compounds within the description of the invention contained herein.

The type of low resistivity, pitch-based carbon fiber preferred in this invention is not only the ultrahigh modulus, high strength type but, particularly, the high thermal conductivity type. The high thermal conductivity feature is highly desirable as it allows a quick and even distribution of temperature when using the superconducting composite, and it is particularly useful for adiabatic stabilization where the composite is used for high field magnet purposes. A thermal conductivity at least as great copper (390 watts/m/° C. at 20° C.) is preferred, and a value of at least twice that of copper is more preferred. Most preferred, is a fiber having a thermal conductivity at least three times that of copper. The pitch-based fibers are particularly preferred herein because in part they have an ultrahigh modulus. The stiffness obtained by such an ultrahigh modulus is particularly advantageous if an electrical conductor to be made from the composites taught. By ultrahigh modulus is meant moduli of at least about 80 Msi and, more preferably, of at least about 100 Msi.

In general, at temperatures below about 600° C. the coefficient of thermal expansion (CTE) of the carbon fiber portion of the inventive composite is negative in the axial direction of the fiber and not far from zero in the radial direction. The solid, ceramic-type superconductors which are to be coated on the fiber generally have an overall positive CTE. Thus, during laydown of the superconductor on the fiber or where the fiber/superconductor composites are temperature cycled, the superconductor coating may crack, loosen, or peel leading to physical property degradation of the composite. To overcome this difficulty the superconductor coating can be laid down over a buffer layer deposited on the fiber prior to laying down the superconductor layer. The buffer layer must be compressible and thick enough to accommodate the contraction of the superconductor layer. This compressible layer may also help to orient the superconductor microcrystals making up the coating such that the planes of lowest electrical resistivity align themselves as fully as possible along the fiber axis. This latter orientation, however obtained, is believed important for obtaining maximum current density along the fiber axis. This compressible layer should also be as inert to the superconductor used as possible. Thickness of the compressible layer is determined by the compressible layer porosity, carbon fiber CTE and superconductor CTE as may be understood by one skilled in the art, but is generally about 100 Angstroms to about 10 microns thick, more particularly about 0.5 micron to about 2 microns thick. One such way of laying down a compressible graphitic layer on a carbon fiber is taught in U.S. Pat. No. 3,799,790, the contents of which are incorporated herein by reference. This patent teaches the vapor deposition of a mixture of pyrolytic carbon and aluminum oxide and heating the result to remove the aluminum oxide leaving behind a porous, compressible, highly-graphitic layer. As may be recognized by one skilled in the art other methods of matching fiber and superconductor CTEs can be used. However, the '790 patent is the preferred method of matching CTEs for this invention.

Some, if not all, of the solid superconductors coated on the carbon fiber to make the composite of the instant invention may react at high temperature with the surface of the carbon fiber, even when using pitch fibers of lowered reactivity, which are the preferred materials. Such a graphitic compressible layer as described above can serve as a protective layer as well as accommodating the different CTEs of fiber and superconductor. This reaction can take place during the laying down of the solid superconductor coating, as above described, or during the high temperature annealing (densification) process normally required in converting the superconductor layer into its superconducting form. Such reaction or corrosion can degrade the properties of the superconducting composite to a marked degree. It is therefore useful in certain instances to lay down a thin, electrically conducting coating over the carbon fiber before laying down the superconductor layer but generally after laying down the compressible layer, if used. Such metals as copper, silver (if the annealing temperature is not too high), gold, transition element carbides and nitrides, and the like can be of service and be both conductive and protective. This layer, if used, is desirably quite thin, on the order of tens of Angstroms thick and less than about 1000 Angstroms thick.

To coat the surface of the carbon fiber a number of different methods may be used. Desirably, one should make the coating reasonably uniform in thickness over the length of the fiber and, very importantly, continuous over the entire fiber surface. For maximum current density and other beneficial effects, care should be taken that the fiber is either continuously covered or essentially continuously covered. Solid superconductor layer thicknesses of 100 Angstroms or more, more preferably about 5000 to about 50,000 Angstroms thick, are desirable to insure an adequate electrical path for use of the composite as a current carrying device. Too thick a layer of the solid superconductor on the fiber can adversely affect the desired fiber flexibility and hence conductor flexibility and is to be avoided except for those uses where a stiff fiber conductor made from the instant composite can be tolerated. Too thin a layer can adversely affect the current density. Where two dimensional carbon fibers are employed (woven and nonwoven fabrics, etc.), flexibility of the composite is not so important. Such two dimensional carbon fiber geometries are useful, for example, for making superconducting composites, used for electrical and magnetic shielding, and conducting tubular conductors which are designed to carry the coolant internally.

Deposition techniques for use herein can be quite varied but obviously some are more suitable for complete fiber coverage than others. For example, a simple technique is to solution coat the carbon fiber by making up a solution, aqueous or non-aqueous, containing the proper amounts of compounds of the elements which are to make up the particular superconductor chosen. Alternatively, the superconductor can be prepared by a dry method and then dissolved in an aqueous oxidizing acid solution, for example, nitric acid. Either solution may then be applied to the carbon fiber, used with or without a compressive layer and/or an outer enrobing layer, by running the fiber through the solution. The fiber is then heated, usually in an appropriate atmosphere to produce the superconductor in a thin coating on the fiber by annealing the superconductor layer to achieve the correct stoichiometry, densification and crystal form. Chemical vapor deposition techniques are particularly useful for the purpose of coating the carbon fiber since the fiber, which has a low electrical resistivity, can be electrically heated. Volatile compounds used to make the superconductor can be then decomposed and deposited by contact with the hot carbon fiber. Halides, organometallic compounds and other volatile compounds can be used for this purpose. Electroplating can be also a particularly good method of putting a metal layer down on the fiber.

Other potentially useful deposition techniques embrace the following:
1. sol-gels and soaps
2. sputtering followed by oxidation
3. electron beam evaporation followed by oxidation
4. liquid phase epitaxy
5. laser induced deposition Care should be taken however, that the method chosen is able to completely cover the surface to be coated—a very desirable condition for all the layers described herein. A final adhering metal or alloy coating of the composite is desirable to protect it from decomposition by air, moisture, etc., and also to provide additional electrical and thermal stabilization. It can also serve as a suitable surface to which electrical connections can be made; for example, connection of the composite to a power source. Such conducting materials as gold, silver, copper, aluminum, solder, and the like, can be used for this purpose. Alternatively, the coating can be of material which is able to be coated at the conductor ends with a solderable material. Such coatings should be relatively thin, about a few hundreds up to about a few thousands of Angstroms thick and are best laid down in a continuous coating by CVD, sputtering, electroplating, etc., as detailed above. Vapor deposition and electroplating methods are preferred.

Figure 2:
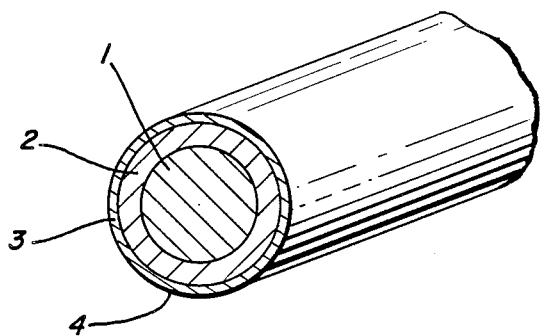
FIG. 2 is a cross-section view of the FIG. 1 composite which additionally has a compressible layer sandwiched between the fiber surface and superconductor layer. The Figures are idealized as the carbon fiber is often axially split giving a "Pac Man" cross-sectional appearance.

In FIG. 1, a cross-sectional view of a composite of the instant invention is shown. The inner ring 1 is the carbon fiber, the middle ring 2 is the superconductor layer, and 4 represents a thin enrobing outer layer. In FIG. 2, the same composite is shown except that an intermediate ring 3, a compressive layer, has been added.

Low resistivity, pitch-based carbon fiber as a substrate for superconductors is not only excellent because of the high strength, high thermal conductivity, inertness and ultrahigh modulus advantages but also because it lends itself to continuous industrial production. For example, carbon yarn could be payed off a supply spool and into a reactor where electrical contacts on the yarn cause it to be locally heated and where a pyrolytic C/Al₂O₃ layer is applied. From this first heated zone, the yarn could travel in a continuous fashion through a second chamber where, again, the yarn is heated by its own electrical resistance to a temperature sufficient to expel the aluminum and oxygen and graphitize the low density compressive carbon layer left behind. The yarn could then enter a third chamber where it is similarly heated and coated with the protective layer if required, initially, and then with the desired superconductor. As the yarn is moved along, other chambers could be placed in the line to adjust the stoichiometry of the superconducting layer or to anneal it in order to optimize its superconducting properties. A following chamber could then apply an outer coating to the yarn, possibly using electroplating, before it is wound on a spool as a finished product.

The following Examples will serve to illustrate certain specific embodiments of the herein disclosed invention. These Examples should not, however, be construed as limiting the scope of the novel invention contained herein as there are many variations which may be made thereon without departing from the spirit of the disclosed invention, as those of skill in the art will recognize.

ILLUSTRATIVE EXAMPLES

EXAMPLE 1

A ceramic-type superconductor is made by intimately mixing and grinding yttrium nitrate, copper (II) nitrate and barium hydroxide in the proper proportions followed by heating the mixture in an inert container in air at about 900° C. The solidified black mass is reground and reheated several times, and its superconducting transition temperature, tested by measuring its resistivity, found to be about 93° K.

A portion of the 1-2-3 superconductor made above is dissolved in an oxidizing inorganic acid and a short length of a pitch-based, high strength THORNEL ® ultrahigh modulus, high thermal conductivity, low resistivity fiber dipped into the dark solution of superconductor. The fiber is dried and annealed in a nitrogen atmosphere by heating briefly at 900° C. followed by a long anneal in flowing oxygen at about 500° C., followed by a slow cool. A resistivity versus temperature test of the yarn shows that its resistivity dropped precipitously at about 83° K., indicating the composite is superconducting at that temperature.

The THORNEL ® fiber used in this Example is made by Amoco Performance Products, Inc., Ridgefield, Conn. 06877 and is a strong, ultra high tensile, pitch-based yarn with the following average properties: strength 350–400 ksi; modulus > about 130 Msi; density about 2.2 g/cc; CTE about 1.9 ppm/° C.; thermal conductivity 1100–1200 W/mK and electrical resistivity about 1.1 $\mu$ohm-m. The yarn is supplied as a continuous roll with a nominal fiber count of about 2000, each filament of an effective diameter about 10 microns. Other details of such fibers are to be found in U.S. Pat. No. 4,005,183 and European Published Application 85-200687.3, both of which are incorporated herein by reference.

EXAMPLE 2

The THORNEL ® fiber of Example 1 is coated with an approximately 1 micron thick coating of aluminum oxide/pyrolytic carbon by the method of U.S. Pat. No. 3,799,790 and the aluminum oxide removed by vacuum evaporation at about 2200° C. leaving a porous, low density, highly graphitic coating on the fiber. The latter is then dipped in the solution of superconductor made up as in Example 1 and dried and annealed in the same way. When its resistivity as a function of temperature is measured, the test showed that the composite's resistivity dropped precipitously at about 83° K. indicating the composite is superconducting at that temperature.

What is claimed is:

1. In a superconducting composite comprising a low resistivity, high strength, high modulus, graphitic, pitch-based carbon fiber coated with an adhering layer of superconductor, the improvement wherein said fiber has a modulus equal to or greater than about 80 MSI and a thermal conductivity at least as great as elemental copper.

2. The composite of claim 1 wherein said ceramic-type superconductor has a superconducting transition temperature above 77° K.

3. The composite of claim 2 wherein said fiber and said layer of ceramic-type superconductor are separated by a compressible layer intimately associated with the surface of said fiber and said ceramic-type superconductor layer.

4. The composite of claim 3 enrobed in a thin adhering outer layer.

5. The composite of claim 4 wherein said fiber is in the form of a continuous fiber.

6. A superconducting composite comprising an above about 350 ksi tensile strength, graphitic, pitch-based carbon fiber of resistivity less than about 20 mohm-m, a thermal conductivity at least about 20% of elemental copper and a modulus of greater than about 20 Msi, said fiber coated with an adhering layer of superconducting mixed oxide having a superconducting transition temperature above 77° K., said mixed oxide of formula $A_1 B_2 Cu_3 O_{7-x}$, wherein A is one or more elements selected from the group consisting of yttrium, lanthanum and the lanthanides, B is one or more Group IIA elements, and x is a number between 0 and 1.

7. The superconducting composition of claim 6 wherein said fiber has a thermal conductivity at least as great as elemental copper and a modulus greater than or equal to 80 MSI.

8. The composite of claim 7 wherein said fiber and said layer of superconducting mixed oxide are separated by a compressible layer intimately associated with said fiber and said solid superconducting mixed oxide layer.

9. The composite of claim 8 enrobed in a thin adhering outer layer.

10. The composite of claim 9 wherein said carbon fiber is in the form of a continuous fiber.

11. The use of the composite of claim 1 in an electrical conductor.

12. The use of the composite of claim 6 in an electrical conductor.

13. The composite of claim 1 in the form of a fabric.

14. The composite of claim 6 in the form of a fabric.

15. The composite of claim 1 in the form of a tape.

16. The composite of claim 6 in the form of a tape.

* * * * *

UNITED STATES PATENT OFFICE
CERTIFICATE OF CORRECTION

Patent No. 4,975,413      Dated December 4, 1990

Inventor(s) Larry C. Satek, William F. Bennett and David Schulz

It is certified that error appears in the above-identified patent and that said Letters Patent is hereby corrected as shown below:

PATENT

| Column | Line | |
|---|---|---|
| 1 | 11 | "super-conductor" should read --superconductor-- |
| 1 | 60 | "article a poor" should read --article shows a poor-- |
| 3 | 64 | "basel" should read --basal-- |
| 4 | 44 | "conductor to be" should read --conductor is to be-- |
| 8 | 19 | "ceramic-type" is omitted before the word superconductor should read --ceramic-type superconductor-- |
| 8 | 37 | "20 mohm-m" should read --20 µohm-m-- |

Signed and Sealed this

Second Day of June, 1992

Attest:

DOUGLAS B. COMER

Attesting Officer     Acting Commissioner of Patents and Trademarks